(12) United States Patent
Im et al.

(10) Patent No.: US 7,687,924 B2
(45) Date of Patent: Mar. 30, 2010

(54) MULTI-PORT MEMORY DEVICE HAVING SERIAL INPUT/OUTPUT INTERFACE

(75) Inventors: Jae-Hyuk Im, Kyoungki-do (KR); Chang-Ho Do, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 426 days.

(21) Appl. No.: 11/645,599

(22) Filed: Dec. 27, 2006

(65) Prior Publication Data

US 2007/0241465 A1  Oct. 18, 2007

(30) Foreign Application Priority Data

Apr. 12, 2006 (KR) .................. 10-2006-0033049

(51) Int. Cl.
*H01L 23/48* (2006.01)
*H01L 23/52* (2006.01)
*H01L 23/40* (2006.01)

(52) U.S. Cl. ...................................... 257/786; 257/784

(58) Field of Classification Search ................ 257/786, 257/784
See application file for complete search history.

(56) References Cited

U.S. PATENT DOCUMENTS

| 6,122,218 | A | 9/2000 | Kang |
| 6,922,341 | B2 | 7/2005 | Quinlan et al. |
| 2003/0233501 | A1 | 12/2003 | Ma et al. |
| 2005/0007170 | A1* | 1/2005 | Nakahara et al. ............. 327/199 |
| 2005/0251713 | A1 | 11/2005 | Lee |
| 2008/0181037 | A1* | 7/2008 | Do et al. ....................... 365/201 |

FOREIGN PATENT DOCUMENTS

KR  1997-0029121  6/1997

* cited by examiner

*Primary Examiner*—Phat X Cao
(74) *Attorney, Agent, or Firm*—IP & T Law Firm PLC

(57) ABSTRACT

A multi-port memory device includes a first package ball out region in which a plurality of balls for a serial I/O interface part are arranged; and a second package ball out region in which a plurality of balls for a dynamic random access memory (DRAM) part are arranged.

4 Claims, 3 Drawing Sheets

MULTI-PORT MEMORY DEVICE HAVING SERIAL INPUT/OUTPUT INTERFACE

FIELD OF THE INVENTION

The present invention relates to a semiconductor memory device, and more particularly, to a multi-port memory device having a serial input/output interface.

DESCRIPTION OF RELATED ART

A conventional dynamic random access memory (DRAM) operates at a relatively lower speed than a chipset connected to an external device. The DRAM operates at a low frequency and forms a data input/output (I/O) path connected in parallel to an interface that is to be connected to an external device. An operating speed of the DRAM is synchronized with that of the chipset in order to increase the entire data transfer rate. However, as faster processing speed is increasingly required, parallel data I/O operation has been limited. Thus, a DRAM using a high-speed serial I/O interface has become necessary.

As a bottleneck phenomenon can occur in a memory system when a single I/O interface is used, it is unreasonable to use a bandwidth that is much smaller than a maximum bandwidth of a memory core. To solve these problems, there is an increasing demand for a memory device that has a plurality of I/O interfaces, i.e., multi-ports, for the purpose of multiple access. It is expected that a memory device having a serial I/O interface and multi-port will be used as a buffer memory of a display device, for example, HD-TV, LCD, etc.

FIG. 1 is a diagram of a package ball out configuration of a ball grid array (BGA) packaging in a conventional 60-ball DDR2 DRAM.

In a single-port memory device having a parallel interface, only a DRAM part operating at a low speed is packaged. Thus, power used in the DRAM is supplied to balls.

However, if the package ball out configuration of FIG. 1 is applied to a multi-port memory device having a serial I/O interface, package efficiency is degraded.

The multi-port memory device having the serial I/O interface has transmission pins and reception pins as many as the ports. The transmission pins and the reception pins have a differential structure for data I/O operation. The operation stability can be secured when package loads of the transmission pins and the reception pins (balls) are equal to one another. In the package ball out configuration of FIG. 1, however, the parallel I/O interface (DQ pin) cannot be replaced with the serial I/O interface. Thus, the package loads of the transmission pins and the reception pins (balls) for the serial I/O interface are not considered.

In addition, because the high-speed serial I/O interface part and the low-speed DRAM part operate together, the unstable power voltage level caused by the abrupt power consumption at one side degrades the operation stability of the other side. For this reason, most of the multi-port memory devices having the serial I/O interface include separate power supplies for the serial I/O interface part and the DRAM part. If the power supplies are separately provided for the different use, it is difficult to configure a power layer that manages the power supply. When two power supplies have different levels, the above-described problems become more serious.

SUMMARY OF THE INVENTION

It is, therefore, an object of the present invention to provide a multi-port memory device having a serial I/O interface, which is capable of providing an efficient package ball out configuration for a structure in which a DRAM part operating at a low frequency and a serial I/O interface part operating at a high frequency coexist.

In accordance with an aspect of the present invention, there is provided a multi-port memory device having a serial I/O interface, including: a first package ball out region in which a plurality of balls for a serial I/O interface part are arranged; and a second package ball out region in which a plurality of balls for a DRAM part are arranged.

In accordance with another aspect of the present invention, there is provided a multi-port memory device having a serial I/O interface, including: a first package ball out region in which a plurality of balls for a serial I/O interface part and a clock part are arranged; and a second package ball out region in which a plurality of balls for a DRAM part are arranged.

In accordance with a further aspect of the present invention, there is provided a multi-port memory device having a serial I/O interface, including: a first package ball out region in which a plurality of balls for a serial I/O interface part are arranged; and a second package ball out region in which a plurality of balls for a DRAM part and a clock part are arranged.

When the multi-port memory device includes the high-speed serial I/O interface part and the low-speed DRAM part, the part for supplying power to the high-speed serial I/O interface part is independently separated from the part for supplying power to the low-speed DRAM part, thereby making it easy to configure the power layer in the package.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

A multi-port memory device in accordance with exemplary embodiments of the present invention will be described in detail with reference to the accompanying drawings.

Figure 1:
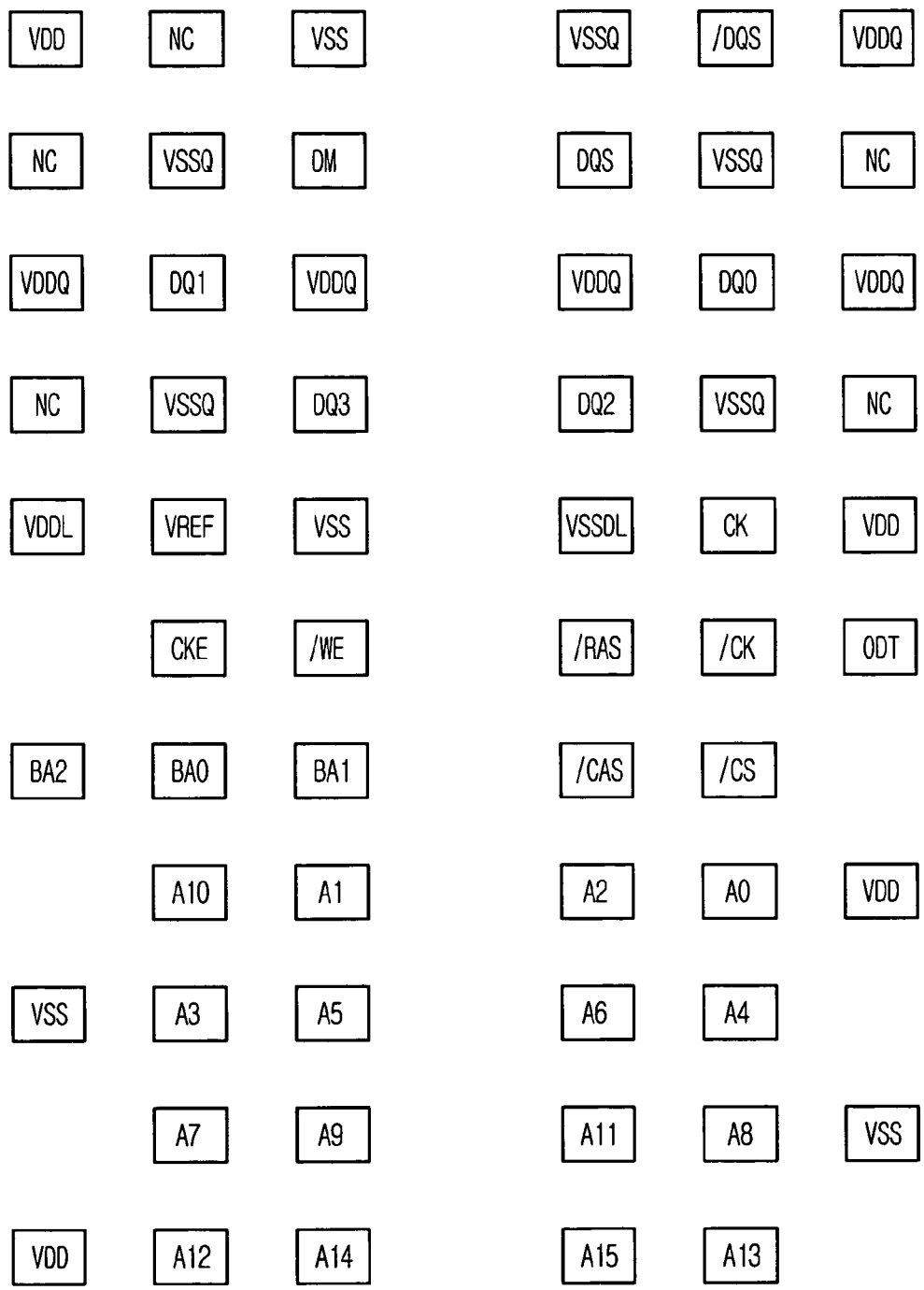
FIG. 1 is a diagram of a package ball out configuration of a BGA packaging in a conventional 60-ball DDR2 DRAM.
Figure 2:
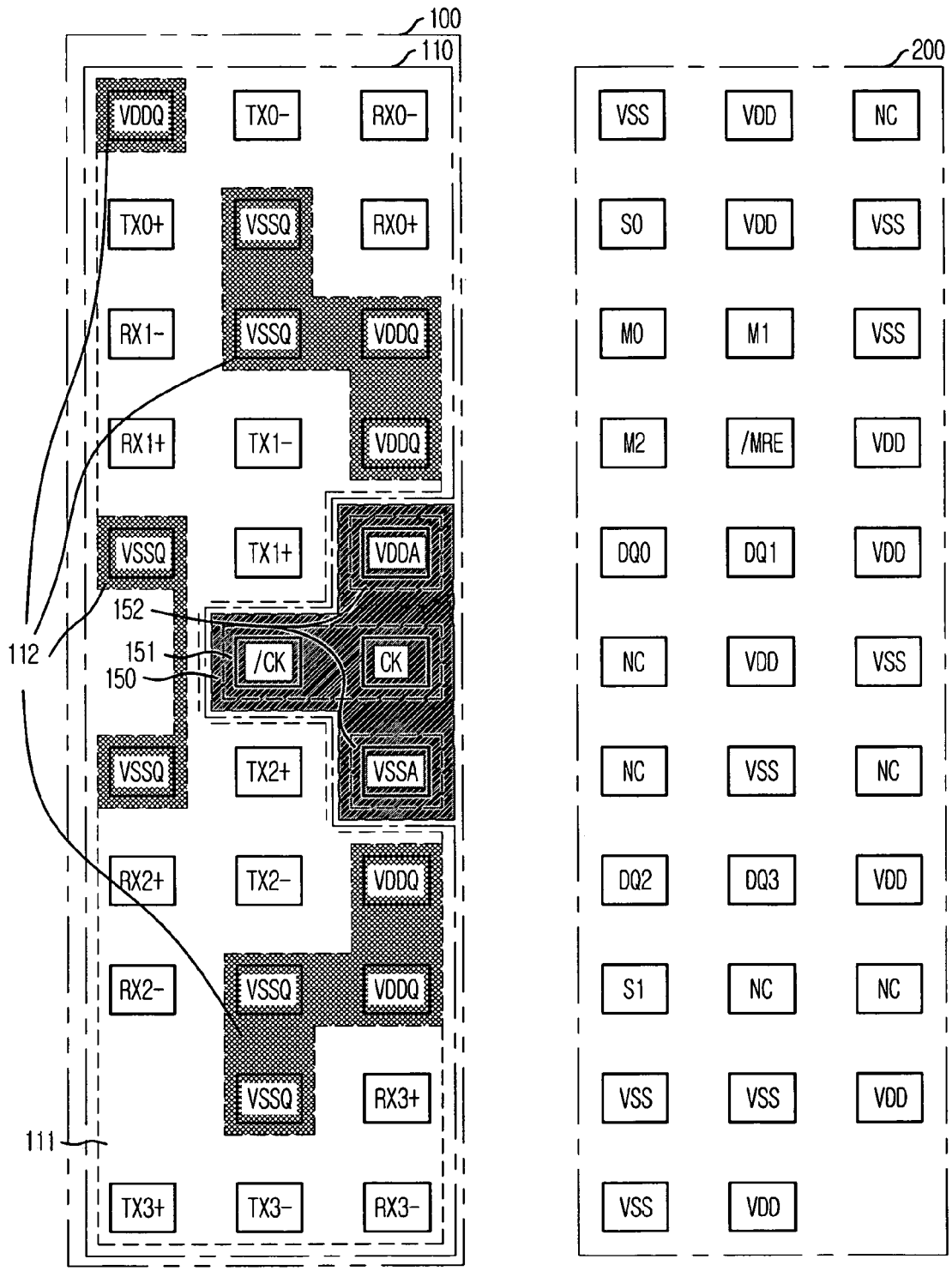
FIG. 2 is a diagram of a package ball out configuration of a multi-port memory device having a serial I/O interface in accordance with a first embodiment of the present invention.

FIG. 2 is a diagram of a package ball out configuration of a multi-port memory device having a serial I/O interface in accordance with a first embodiment of the present invention.

The package ball out configuration in accordance with the first embodiment of the present invention includes a first package ball out region 100 and a second package ball out region 200, which are arranged at the left and right sides of a vertical center line, respectively.

Balls 110 for a serial I/O interface part and balls 150 for a clock interface part are arranged in the first package ball out region 100, and balls for a DRAM interface part are arranged in the second package ball out region 200.

In the first package ball out region 100, the balls 110 for the serial I/O interface part include serial data balls 111 and serial power/ground balls 112. The serial data balls 111 are used for serial data communication TX0+/TX0−, RX0+/RX0−, TX1+/TX1−, RX1+/RX1−, TX2+/TX2−, RX2+/RX2−, TX3+/TX3− and RX3+/RX3−. The serial power/ground balls 112 are used to supply power voltage VDDQ and ground voltage VSSQ to the serial data balls 111.

The balls 150 for the clock interface part include clock interface balls 151 and clock power/ground balls 152. The clock interface balls 151 are used to transfer clock signals CK and /CK, and the clock power/ground balls 152 are used to supply power voltage VDDA and ground voltage VSSA to the clock interface balls 151.

In the package ball out configuration of FIG. 2, the first package ball out region 100 having the power/ground balls VDDQ and VSSQ of the high-speed serial I/O interface is independently separated from the second package ball out region 200 having the power/ground balls VDD and VSS of the low-speed DRAM part. This makes it easy to configure the power layer of the package.

In addition, the serial data balls 111 are arranged in a differential structure (TX+/TX−, RX+/RX−) for data I/O operation. The data I/O parts of the serial I/O interface are separated into the transmit pins (TX+, TX−) and the receive pins (RX+, RX−) in each port. Therefore, the stability of the data I/O operation can be secured. That is, because TX0+/TX0−, RX0+/RX0−, TX1+/TX1−, RX1+/RX1−, TX2+/TX2−, RX2+/RX2−, TX3+/TX3− and RX3+/RX3− are separately arranged, the loads of the I/O package ball out can be equal to one another.

Figure 3:
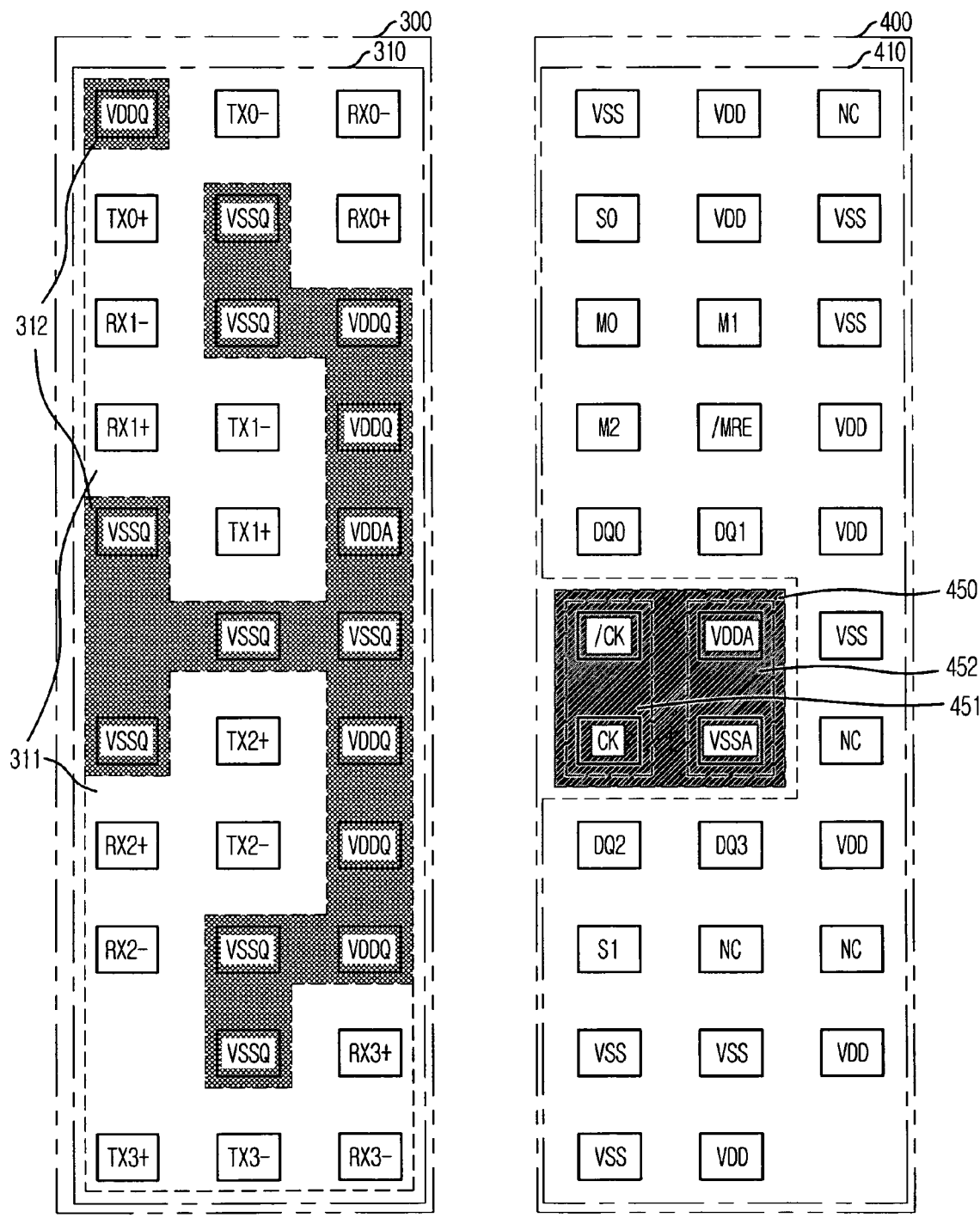
FIG. 3 is a diagram of a package ball out configuration of a multi-port memory device having a serial I/O interface in accordance with a second embodiment of the present invention.

FIG. 3 illustrates a package ball out configuration of a multi-port memory device having a serial I/O interface in accordance with a second embodiment of the present invention.

The package ball out configuration in accordance with the second embodiment of the present invention includes a first package ball out region 300 and a second package ball out region 400, which are arranged at the left and right sides of a vertical center line, respectively.

Balls 310 for a serial I/O interface are arranged in the first package ball out region 300. Balls 450 for a clock interface part and balls 410 for a DRAM interface part are arranged in the second package ball out region 400. Since the package ball out configuration of FIG. 3 is different from that of FIG. 2 only in terms of the arrangement of the balls 450 for the clock interface part, its detailed description will be omitted for conciseness.

As described above, the power layer of the package can be easily configured by separately arranging the high-speed serial I/O interface part and the low-speed DRAM part. More-over, the data I/O configuration of the independent serial I/O interface part is separately arranged, thereby securing the data stability.

The present application contains subject matter related to Korean patent application No. 2006-33049, filed in the Korean Intellectual Property Office on Apr. 12, 2006, the entire contents of which are incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A multi-port memory device having a serial input/output interface, the memory device comprising:
   a first package ball out region in which a plurality of balls for a serial I/O interface part are arranged; and
   a second package ball out region in which a plurality of balls for a dynamic random access memory (DRAM) part are arranged,
   wherein the first package ball out region is separated from the second package ball out region.

2. A multi-port memory device having a serial input/output interface, the memory device comprising:
   a first package ball out region in which a plurality of balls for a serial input/output interface part and a clock part are arranged; and
   a second package ball out region in which a plurality of balls for a dynamic random access memory (DRAM) part are arranged,
   wherein the first package ball out region is separated from the second package ball out region.

3. The multi-port memory device of claim 2, wherein the plurality of balls for the serial input/output interface part include:
   a plurality of serial data balls for performing serial data communication; and
   a plurality of serial power/ground balls for supplying power voltage and ground voltage to the serial data balls.

4. The multi-port memory device of claim 2, wherein the balls for the clock part include:
   a plurality of clock interface balls for transferring clock signals; and
   a plurality of clock power/ground balls for supplying power voltage and ground voltage to the clock interface balls.

* * * * *